(12) United States Patent
Miwa

(10) Patent No.: US 7,009,684 B2
(45) Date of Patent: Mar. 7, 2006

(54) EXPOSURE APPARATUS AND EXPOSURE METHOD

(75) Inventor: Yoshinori Miwa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/936,525

(22) Filed: Sep. 9, 2004

(65) Prior Publication Data

US 2005/0030505 A1   Feb. 10, 2005

Related U.S. Application Data

(62) Division of application No. 09/987,568, filed on Nov. 15, 2001, now Pat. No. 6,829,038.

(30) Foreign Application Priority Data

Nov. 17, 2000 (JP) .............................. 2000-350817

(51) Int. Cl.
  G03B 27/42 (2006.01)
  G03B 27/52 (2006.01)
  G03B 27/62 (2006.01)

(52) U.S. Cl. .............................. 355/53; 355/30; 355/75

(58) Field of Classification Search ................... 355/30, 355/53, 72–76; 414/935, 225
See application file for complete search history.

(56) References Cited

U.S. PATENT DOCUMENTS

| 4,690,528 A | * | 9/1987 | Tanimoto et al. ........... 353/101 |
| 4,999,671 A | | 3/1991 | Iizuka ......................... 355/97 |
| 5,243,377 A | * | 9/1993 | Umatate et al. .............. 355/53 |
| 5,559,584 A | * | 9/1996 | Miyaji et al. ................. 355/73 |
| 6,337,732 B1 | | 1/2002 | Nakamura .................... 355/30 |
| 6,414,744 B1 | * | 7/2002 | Kuiper et al. ................ 355/75 |
| 6,451,507 B1 | * | 9/2002 | Suenaga et al. ............. 430/311 |

FOREIGN PATENT DOCUMENTS

| JP | 6-260386 | 9/1994 |
| JP | 7-321179 | 12/1995 |
| JP | 2000-294496 | 10/2000 |

* cited by examiner

Primary Examiner—Henry Hung Nguyen
(74) Attorney, Agent, or Firm—Fitzpatrick, Cella, Harper & Scinto

(57) ABSTRACT

An exposure apparatus for exposing a substrate using a plurality of masters. The apparatus includes a stage being able to install at least one of the plurality of masters, a first housing surrounding the stage, a second housing for stocking at least one of the plurality of masters, the second housing being installed adjacent to the first housing or installed in an interior of the first housing, the second housing being allowed to communicate with the first housing, and a third housing being installed between an inside space and an outside space of the first housing, the third housing being different from the first and second housings. The first and second housings are filled by an inert gas or are adapted to be evacuated.

10 Claims, 8 Drawing Sheets

FIG. 6

| URL | http://www.maintain.co.jp/db/input.html |

TROUBLE DB INPUT WINDOW

OCCURRENCE DATE [ 2000/3/15 ] ~404
TYPE OF APPARATUS [ ********* ] ~401
SUBJECT [ OPERATION ERROR (START-UP ERROR) ] ~403
DEVICE S/N [ 465NS4580001 ] ~402
DEGREE OF URGENCY [ D ] ~405

SYMPTOM: LED IS KEPT FLICKERING AFTER POWER-ON ~406

REMEDY: POWER ON AGAIN (PRESS RED BUTTON IN ACTIVATION) ~407

PROGRESS: INTERIM HAS BEEN DONE. ~408

[SEND] [RESET]

| 410 | 411 | 412 |
| LINK TO RESULT LIST DATABASE | SOFTWARE LIBRARY | OPERATION GUIDE |

SEMICONDUCTOR DEVICE MANUFACTURING FLOW

EXPOSURE APPARATUS AND EXPOSURE METHOD

This application is a divisional application of copending U.S. patent application Ser. No. 09/987,568, filed Nov. 15, 2001 which is now U.S. Pat. No. 6,829,038.

FIELD OF THE INVENTION

The present invention relates to an exposure apparatus for exposing a substrate such as a wafer or glass plate coated with a photosensitive agent to a circuit pattern on a master such as a reticle or mask in a lithography step for manufacturing various devices such as a semiconductor element, a liquid crystal element, and a thin-film magnetic head and, particularly, to a master transfer system for the exposure apparatus.

BACKGROUND OF THE INVENTION

An exposure apparatus for manufacturing a semiconductor integrated circuit irradiates a wafer with an exposure beam of various wavelength bands in accordance with a circuit pattern. An exposure beam emitted by a light source illuminates a reticle via an illumination optical system. A fine circuit pattern formed on the reticle is imaged onto a wafer via a projection optical system by exposure and transfer.

In order to increase the integration degree of a semiconductor integrated circuit, the circuit pattern must shrink in feature size, which requires a higher resolving power of the projection optical system. Effective means for increasing the resolving power are a method of increasing the numerical aperture (also called NA) of the projection optical system and a method of decreasing the wavelength of an exposure beam.

As exposure beams, a g-line (wavelength: 436 [nm]), an i-line (wavelength: 365 [nm]), a KrF excimer laser (wavelength: 248 [nm]), and an ArF excimer laser (wavelength: 193 [nm]) have already been put into practice. An exposure technique by an $F_2$ excimer laser (wavelength: 157 [nm]) as a next-generation exposure beam has been put into practical use.

The wavelength band of the $F_2$ excimer laser is different from the conventional ones described above in that light is readily absorbed by oxygen or moisture. It is also known that light is absorbed by ammonia ($NH_3$), carbon dioxide ($CO_2$), organic gas, ozone, and the like. The atmosphere in the optical path of an $F_2$ laser beam must be controlled to suppress a light absorber to low density. Hence, the atmosphere in the optical path around a reticle and wafer often exchanged on the exposure apparatus is also controlled similarly to the atmosphere in optical systems such as an illumination optical system and a projection optical system. As an effective atmospheric control method, the optical path space is purged with inert gas such as helium gas (He) or nitrogen gas ($N_2$), or the optical path space is evacuated.

In terms of the throughput of the exposure apparatus, control of the optical path atmosphere enables exposure at high illuminance and shortens the exposure time, resulting in high throughput. To achieve higher throughput, however, the exchange time for reticles and wafers, which are frequently exchanged, must also be shortened. In recent years, a multiple exposure method of exposing the same shot on a wafer a plurality of number of times by using circuit patterns on a plurality of reticles has been put into practical use, improving the image quality of exposure/transfer on a wafer. Demands become stronger for shortening the time taken to transfer a substrate such as a reticle or wafer.

Prior art examples of a substrate transfer system for a reticle or the like in an exposure apparatus will be described.

Japanese Patent Laid-Open No. 7-321179 discloses a system of loading a reticle from a reticle library to a predetermined position in a temporary stocker by a multi-axial robot hand, and transferring the reticle to a reticle stage by a robot hand having vertical and rotating drive shafts.

Japanese Patent Laid-Open No. 2000-294496 discloses a substrate transfer system coping with an openable closed substrate vessel called an SMIF pod. In this system, a substrate in the SMIF pod is located into an exposure apparatus by an opening/closing elevating mechanism called an SMIF indexer. The substrate is transferred to a temporary substrate stocker by a first multiaxial robot, and transferred by a second multiaxial robot to a pre-alignment stage for aligning a substrate to a predetermined reference. The substrate is then transferred by a transfer hand to a substrate stage for holding a substrate.

Japanese Patent Laid-Open No. 6-260386 discloses an exposure apparatus and a reticle transfer system. This apparatus comprises a first chamber in which a reticle to be exposed is airtightly contained and the interior is purged with inert gas, a reticle exchange mechanism for exchanging the reticle with one to be exposed next, a second chamber in which the reticle to be exposed next is airtightly contained and the interior is purged with inert gas, and an opening/closing means for interrupting/allowing communication between the first and second chambers.

Of these prior art systems, Japanese Patent Laid-Open Nos. 7-321179 and 2000-294496 aim to shorten the substrate transfer time. Japanese Patent Laid-Open No. 6-260386 aims to enable reticle exchange without disturbing the inert gas atmosphere in the reticle stage space.

However, the prior art systems suffer from the following problems.

Japanese Patent Laid-Open Nos. 7-321179 and 2000-294496 do not disclose any atmosphere control means regarding the space around a reticle. These systems are not practical reticle transfer systems in an exposure apparatus using an $F_2$ excimer laser as described above. If the atmosphere in the whole reticle transfer system disclosed is simply controlled to reduce a light absorber, the exposure apparatus becomes bulky, complicated in structure, and very high in cost.

Japanese Patent Laid-Open No. 6-260386 discloses a system of purging the space around a reticle with inert gas, as described above. However, the second chamber is a so-called load-lock chamber. In the layout of directly connecting the load-lock chamber to the first chamber, a reticle to be exposed next is supplied only after the completion of gas purge in the load-lock chamber for every reticle exchange. This system is effective only when the reticle exchange frequency is very low and the time required to complete gas purge of the load-lock chamber is shorter than the reticle exchange interval. If the reticle exchange frequency is very high, the throughput greatly decreases.

SUMMARY OF THE INVENTION

The present invention has been made to overcome the conventional drawbacks, and has as its object to provide a high-throughput exposure apparatus for realizing both low light absorption loss in the optical path of an exposure beam around a master and a short master exchange time.

According to the present invention, the foregoing object is attained by providing an exposure apparatus for transferring a pattern on a master onto a substrate via an optical system comprising:

a first housing for surrounding an exposure position of the master;

a second housing for stocking the master; and a third housing for transferring the master between an inside and an outside of said first housing, wherein an interior of each housing is controlled to a predetermined atmosphere.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 6 is a view showing an example of a user interface in the semiconductor device production system including the exposure apparatus according to the embodiment of the present invention;

DETAILED DESCRIPTION OF THE PREFERRED EMBODIMENTS

Preferred embodiments of the present invention will be described in detail with reference to the accompanying drawings.

<First Embodiment>

Figure 1:
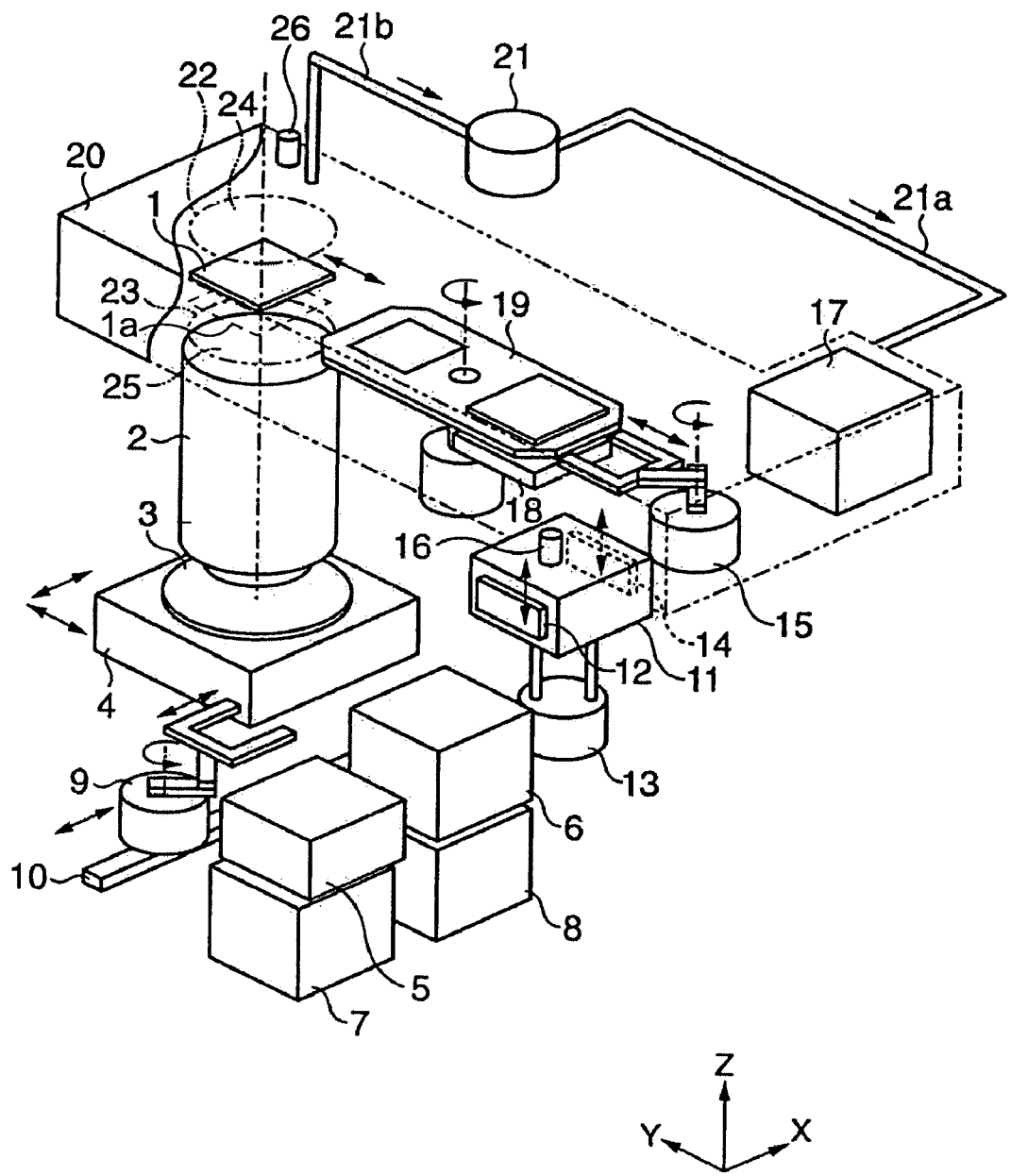
FIG. 1 is a perspective view showing an exposure apparatus according to the first embodiment of the present invention.

FIG. 1 is a perspective view showing an exposure apparatus according to the first embodiment of the present invention. FIG. 1 particularly shows the interior of a chamber which covers the overall exposure apparatus, keeps the interior of the exposure apparatus at a predetermined temperature, and keeps dust to a low level.

In FIG. 1, reference numeral 1 denotes a reticle bearing a circuit pattern. This circuit pattern is illuminated via an illumination optical system (not shown) with a beam emitted by an $F_2$ excimer laser having an oscillation wavelength around 157 [nm]. The pattern is projected on a wafer 3 at a predetermined magnification via a projection optical system 2. The wafer 3 is set on a wafer stage 4 having driving shafts in at least the X and Y directions of the coordinate system shown in FIG. 1. The reticle 1 is set on a reticle stage 1a, and driven in at least the Y direction. The exposure apparatus shown in FIG. 1 is a step and scan type exposure apparatus, which performs scanning exposure in the Y direction while making the reticle 1 and wafer 3 be in synchronism with each other, and sequentially moves the target shot to a next one, step by step.

Reference numerals 5 and 6 denote pods, which are openable closed vessels for storing a plurality of reticles 1 and are called SMIF pods; and 7 and 8, SMIF indexers having driving mechanisms (not shown) for opening the SMIF pods 5 and 6 so as to allow extracting the reticles 1 from the SMIF pods 5 and 6. The reticles 1 ready to be unloaded by the SMIF indexers 7 and 8 are extracted by a multiaxial transfer robot 9, and transferred to a load-lock chamber 11 along a guide 10. One side of the load-lock chamber 11 is equipped with an opening/closing unit 12. The reticle 1 transferred by the multiaxial transfer robot 9 is loaded into the load-lock chamber 11 via the opening/closing unit 12, which is open. After that, the opening/closing unit 12 is closed, and a nitrogen gas purge control 13 purges the interior of the load-lock chamber 11 with nitrogen gas.

Although the first embodiment exemplifies the use of nitrogen gas, the present invention may use helium gas or adopt evacuation without using any inert gas. A desirable atmosphere will be described in detail below.

After the interior of the load-lock chamber 11 is purged to a predetermined stage with nitrogen gas, an opening/closing unit 14 on the other side of the load-lock chamber 11 is opened, and the reticle 1 in the load-lock chamber 11 is extracted by a multiaxial transfer robot 15. Whether nitrogen gas purge in the load-lock chamber 11 reaches a predetermined stage is judged by a control unit (not shown) on the basis of the detection result of a gas detector 16. If nitrogen gas purge is judged to reach the predetermined stage, the opening/closing unit 14 is opened. The multiaxial transfer robot 15 receives the reticle 1 in the load-lock chamber 11 and transfers it to a temporary reticle stock unit 17.

The temporary reticle stock 17 has a shelf-like structure (shelf-like stock unit) so as to stock a plurality of reticles 1, and a shelf elevating mechanism (not shown) movable in the Z direction so as to adjust the reticle transfer height of the multiaxial transfer robot 15 to the height of a shelf to which the reticle 1 is to be stocked. The temporary reticle stock unit 17 further comprises a detection unit (not shown) for detecting the presence/absence of the reticle 1 on each shelf, and a reading unit (not shown) for a barcode formed at a predetermined position of the reticle 1. All information about the relationship between stocked reticles 1 and their shelves is stored in the control unit (not shown).

The above-described operation is repeated parallel to an exposure operation of a circuit pattern on the reticle 1 at an exposure position. The temporary reticle stock unit 17 stocks a plurality of reticles 1 up to a stockable number of reticles.

Of a plurality of reticles 1 stocked in the temporary reticle stock unit 17, one to be exposed next is extracted by the multiaxial transfer robot 15, and set on an alignment stage 18. The reticle 1 is aligned in the X direction, the Y direction, or a direction around the Z-axis on the alignment stage 18 so as to decrease the shift amount from an alignment reference (not shown) to a desired amount or less. Then, the reticle 1 waits for exposure.

After a reticle 1 transferred to an exposure position on the reticle stage 1a is exposed, the reticle stage moves to the transfer position of a rotary hand 19, and the exposed reticle 1 is transferred to the rotary hand 19. The rotary hand 19 receives the reticle 1, which has been set on the alignment stage 18, and waits for exposure. At this time, the rotary hand 19 holds both the exposed reticle 1, and the reticle 1 which waits for exposure. In this state, the rotary hand 19 rotates to transfer the exposed reticle 1 to the alignment stage 18 and the reticle 1 which waits for exposure to the reticle stage 1a.

The reticle 1 which waits for exposure is transferred to an exposure position, and exposed. The exposed reticle 1 is transferred to the multiaxial transfer robot 15. If the reticle 1 is to be exposed again, it is transferred to the temporary reticle stock unit 17 and temporarily stocked. If the reticle 1 is not to be exposed again, the opening/closing unit 14 and the load-lock chamber 1 is opened, and the reticle 1 is transferred to the load-lock chamber 11. Then, the opening/closing unit 14 is closed, and the other opening/closing unit 12 is opened. The reticle 1 transferred to the load-lock chamber 11 is extracted by the multiaxial transfer robot 9, stored at any position in the SMIF indexer 7 or 8, and finally stored in either of the SMIF pods 5 and 6.

Reference numeral 20 denotes a closed vessel for interrupting ventilation to the atmosphere. The interior of the closed vessel 20 is purged with nitrogen gas by a nitrogen gas purge control unit 21. In the first embodiment, the closed vessel 20 houses the reticle 1, reticle stage (not shown), multiaxial transfer robot 15, alignment stage 18, rotary hand 19, and temporary reticle stock unit 17. In loading/unloading a reticle into/from the closed vessel 20, the load-lock chamber 11 enables loading/unloading without substantially influencing the atmosphere in the closed vessel 20. The opening/closing unit 14 of the load-lock chamber 11 allows/interrupts communication between the closed vessel 20 and the load-lock chamber 11.

Although the interiors of the closed vessel 20 and load-lock chamber 11 are purged with nitrogen gas in the first embodiment, they may be purged with, e.g., helium gas, or a mixture of nitrogen gas and helium gas. Instead of the above-described purge with inert gas, the interiors of the closed vessel 20 and load-lock chamber 11 may be evacuated.

The closed vessel 20 has openings 22 and 23 for transmitting an exposure beam. Optical elements 24 and 25 for ensuring airtightness are arranged near the openings 22 and 23. The optical element 24 may serve as, e.g., an optical element of the illumination optical system (not shown) that is nearest to the reticle 1. Similarly, the optical element 25 may serve as, e.g., an optical element of the projection optical system 2 that is nearest to the reticle 1.

Nitrogen gas purge in the closed vessel 20 by the nitrogen gas purge control unit 21 will be explained in detail below.

Nitrogen gas from the nitrogen gas purge control unit 21 is supplied from the vicinity of the temporary reticle stock unit 17 via a pipe system 21a. Nitrogen gas with a relatively high purity is first supplied to the stocked reticle 1, thereby preventing deposition of an impurity or the like on the surface of the reticle 1 stocked in the temporary reticle stock unit 17. The nitrogen gas supplied to the closed vessel 20 is discharged from a pipe system 21b laid out on the reticle stage side. The discharged nitrogen gas may be directly discharged from the exposure apparatus, or the nitrogen gas purge control unit 21 may incorporate a circulation path extending to the pipe system 21a via a cleaning means (not shown) such as a filter for removing the impurity.

A gas detector 26 is adopted to detect a nitrogen gas purge state in the closed vessel 20. If the detection result exhibits an impurity concentration higher than a predetermined stage, the gas supply amount from the pipe system 21a is increased. If the impurity density decreases to a predetermined stage or less, the gas supply amount from the pipe system 21a is decreased. In this way, the gas flow rate is desirably controlled. This gas flow rate control can reduce the nitrogen gas consumption amount in the arrangement of discharging nitrogen gas from the exposure apparatus.

The control unit (not shown) controls the operations of the reticle stage 1a for holding the reticle 1, the wafer stage 4, the driving mechanisms (not shown) of the SMIF indexers 7 and 8, the multiaxial transfer robots 9 and 15, the opening/closing units 12 and 14, the alignment stage 18, the rotary hand 19, and the shelf elevating mechanism (not shown) of the temporary reticle stock unit 17.

As described above, according to the first embodiment, a master (reticle 1) is set in the first housing (closed vessel 20) controlled to a predetermined atmosphere at an exposure position. The master (reticle 1) can be placed in an environment in which a substance such as oxygen or moisture which absorbs an exposure beam is suppressed to a low level. The third housing (load-lock chamber 11) enables transferring the master (reticle 1) without influencing the environment in the first housing (closed vessel 20) in loading/unloading the master (reticle 1) into/from the first housing (closed vessel 20).

The second housing (temporary reticle stock unit 17) can stock a plurality of masters (reticles 1) loaded to the exposure apparatus. This can shorten the transfer path from the stock position of the master (reticle 1) to an exposure position. The atmosphere in the second housing (temporary reticle stock unit 17) is so controlled as not to disturb the atmosphere in the first housing (closed vessel 20) in exchanging the master (reticle 1) at the exposure position. This can shorten the time taken to exchange the master (reticle 1) and to start exposure. As a result, high throughput can be realized without greatly increasing the apparatus cost.

<Second Embodiment>

The second embodiment of the present invention will be described with reference to FIG. 2.

Figure 2:
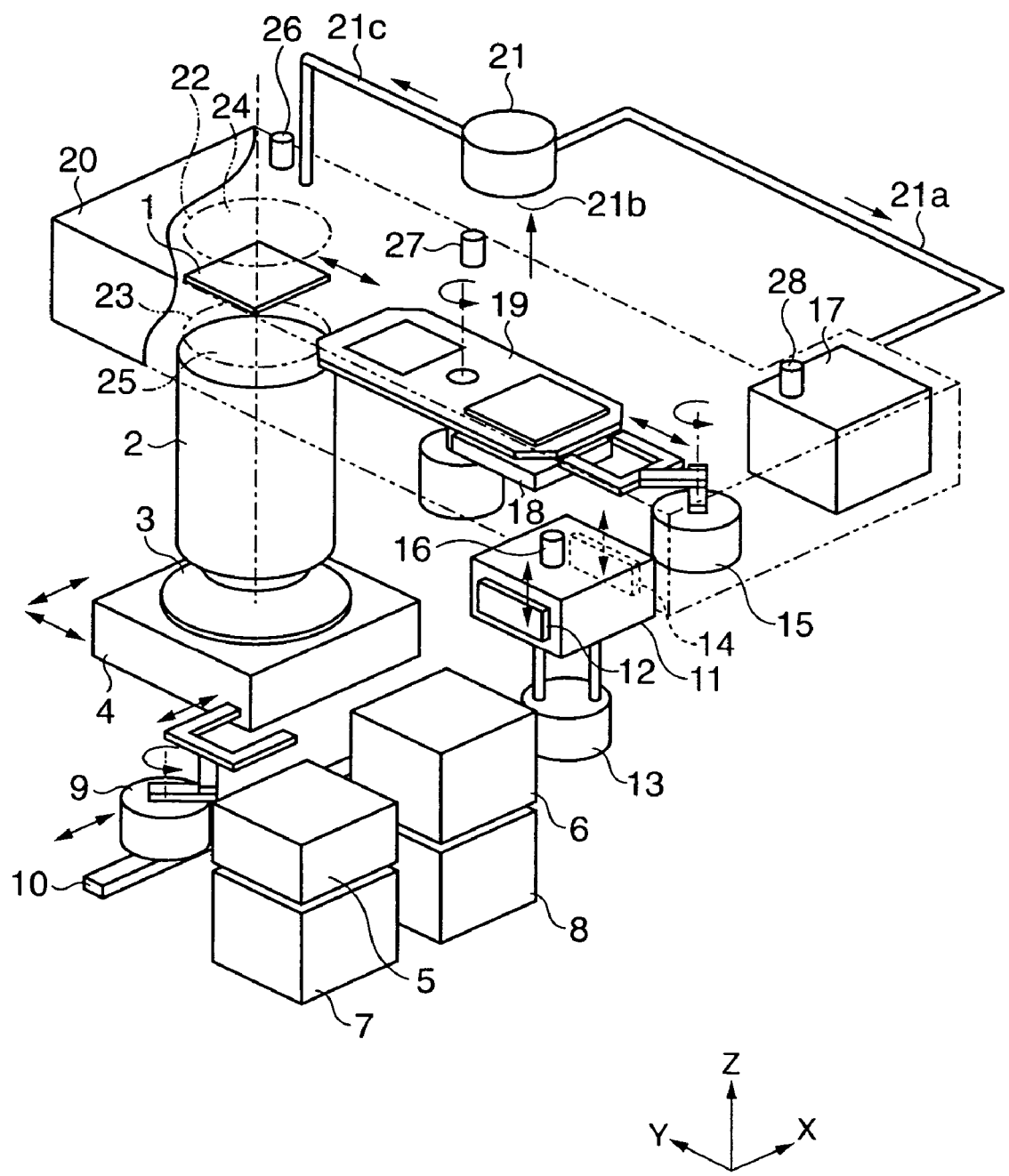
FIG. 2 is a perspective view showing the second embodiment of the present invention.

FIG. 2 shows a modification of the nitrogen gas supply to the closed vessel 20 in FIG. 1. The same reference numerals as in FIG. 1 denote the same parts, and a description thereof will be omitted.

Nitrogen gas from a nitrogen gas purge control unit 21 is supplied into a closed vessel 20 via pipe systems 21a and 21c. Similar to the first embodiment, the pipe system 21a supplies nitrogen gas to the vicinity of a temporary reticle stock unit 17. The pipe system 21c supplies nitrogen gas to the vicinity of a reticle stage (not shown), i.e., exposure position. A pipe system 21b discharges gas in the closed vessel 20. Similar to the first embodiment, gas may be directly discharged from the exposure apparatus, or the nitrogen gas purge control unit 21 may incorporate a circulation path extending to the pipe systems 21a and 21c via a cleaning means (not shown) such as a filter for removing the impurity.

By supplying/discharging nitrogen gas by the pipe systems 21a, 21b, and 21c, nitrogen gas with a relatively high purity can be supplied to a stocked reticle 1 and the optical path of an exposure beam near the reticle stage. Deposition of an impurity on the surface of the reticle 1 which is being stocked or exposed can be prevented. Compared to the first embodiment, the light absorption preventing effect for the optical path of an exposure beam near the reticle stage can be enhanced.

The second embodiment employs gas detectors 27 and 28 to detect nitrogen gas concentrations at three positions in the closed vessel 20 together with the gas detector 26 in the first embodiment. The gas detectors, however, are not limited to three portions as in the second embodiment. The layout positions and the number of gas detectors are desirably determined as needed.

<Third Embodiment>

Figure 3:
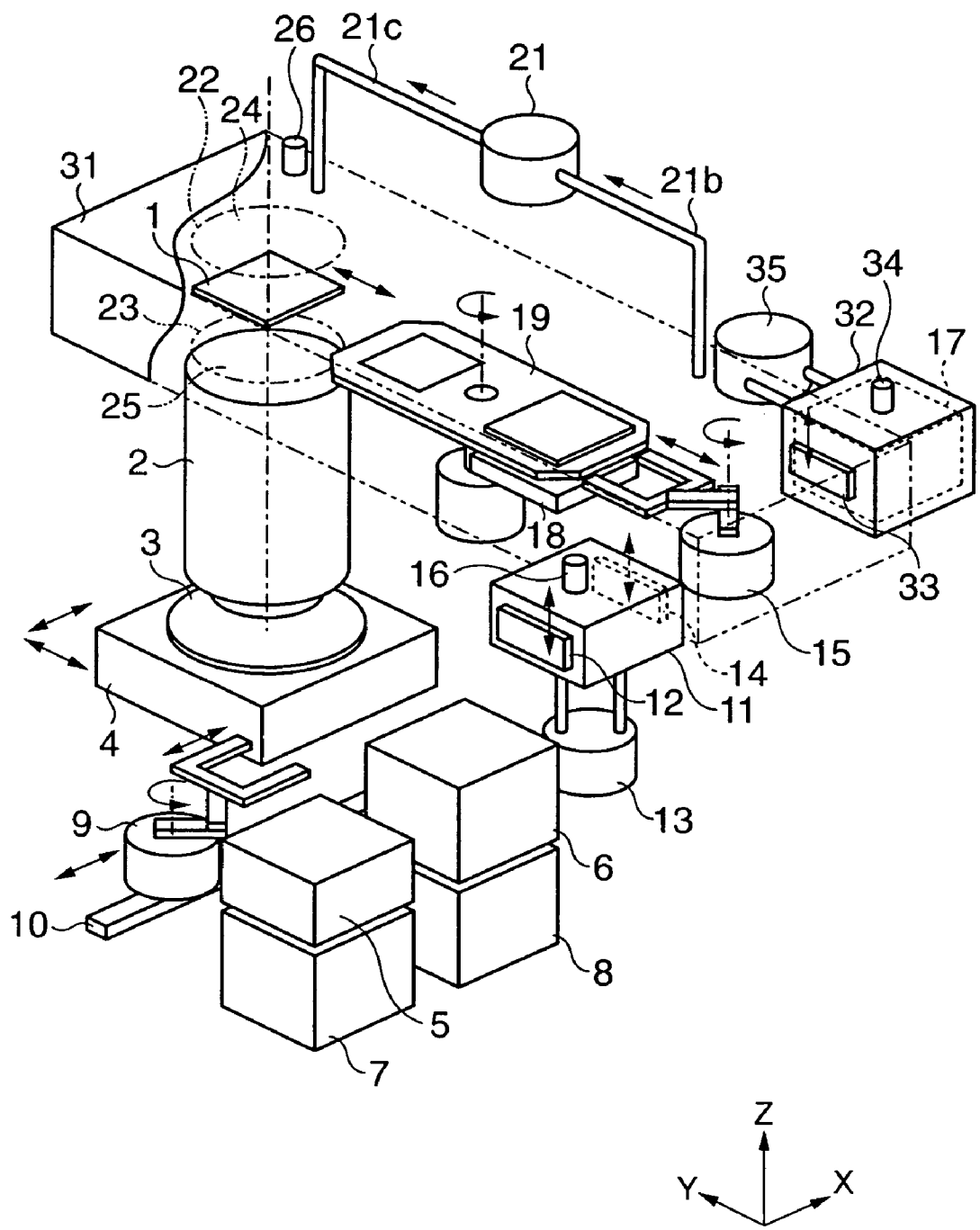
FIG. 3 is a perspective view showing the third embodiment of the present invention.

The third embodiment of the present invention will be described with reference to FIG. 3. FIG. 3 is a perspective view showing an exposure apparatus according to the third embodiment of the present invention. The same reference numerals as in FIGS. 1 and 2 denote the same parts, and a description thereof will be omitted.

Reference numeral 31 denotes a closed vessel, which is different from the closed vessel 20 of FIG. 1 in that the closed vessel 31 does not house a temporary reticle stock unit 17. The temporary reticle stock unit 17 is housed in another closed vessel 32 (including a control means for a shelf elevating mechanism and the like). The closed vessel 32 comprises an opening/closing unit 33 for allowing/interrupting communication between the closed vessels 31 and 32. The third embodiment further adopts a gas detector 34 and nitrogen gas purge control unit 35 to control the atmosphere in the closed vessel 32. The reticle transfer path and the operation procedures of respective elements in the third embodiment are the same as those in the first embodiment, and a description thereof will be omitted. The third embodiment is different from the first embodiment in that the opening/closing unit 33 is opened/closed in loading/unloading a reticle 1 into/from the temporary reticle stock unit 17.

The first to third embodiments (see FIGS. 1, 2, and 3) have been described. The exposure apparatus according to the present invention can be applied to not only the above-mentioned step and scan type exposure apparatus, but also a step and repeat type exposure apparatus (called a stepper).

Each of the above embodiments has exemplified a reticle transfer system coping with an SMIF pod. The present invention is not limited to this, and can also be applied to a reticle transfer system coping with a storage means of a reticle library form for storing a plurality of cassettes called reticle cassettes, which store reticles one by one. The present invention can also be applied to a reticle transfer system coping with another mini-environment scheme called a FOUP (Front Opening Unified Pod).

Each of the above embodiments has described an exposure apparatus using a light-transmitting reticle. The present invention can also be applied to an exposure apparatus using a reflecting reticle which uses a light source with a wavelength around 13.5 [nm] (EUV: Extreme UltraViolet) or the like. In this case, the closed vessels 20, 31 and 32 and the load-lock chamber 11 are desirably evacuated instead of purged with nitrogen gas or helium gas.

<Embodiment of A Semiconductor Production System>

A production system for producing a semiconductor device (e.g., a semiconductor chip such as an IC or LSI, liquid crystal panel, CCD, or thin-film magnetic head, micromachine, or the like) using the above-described exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 4:
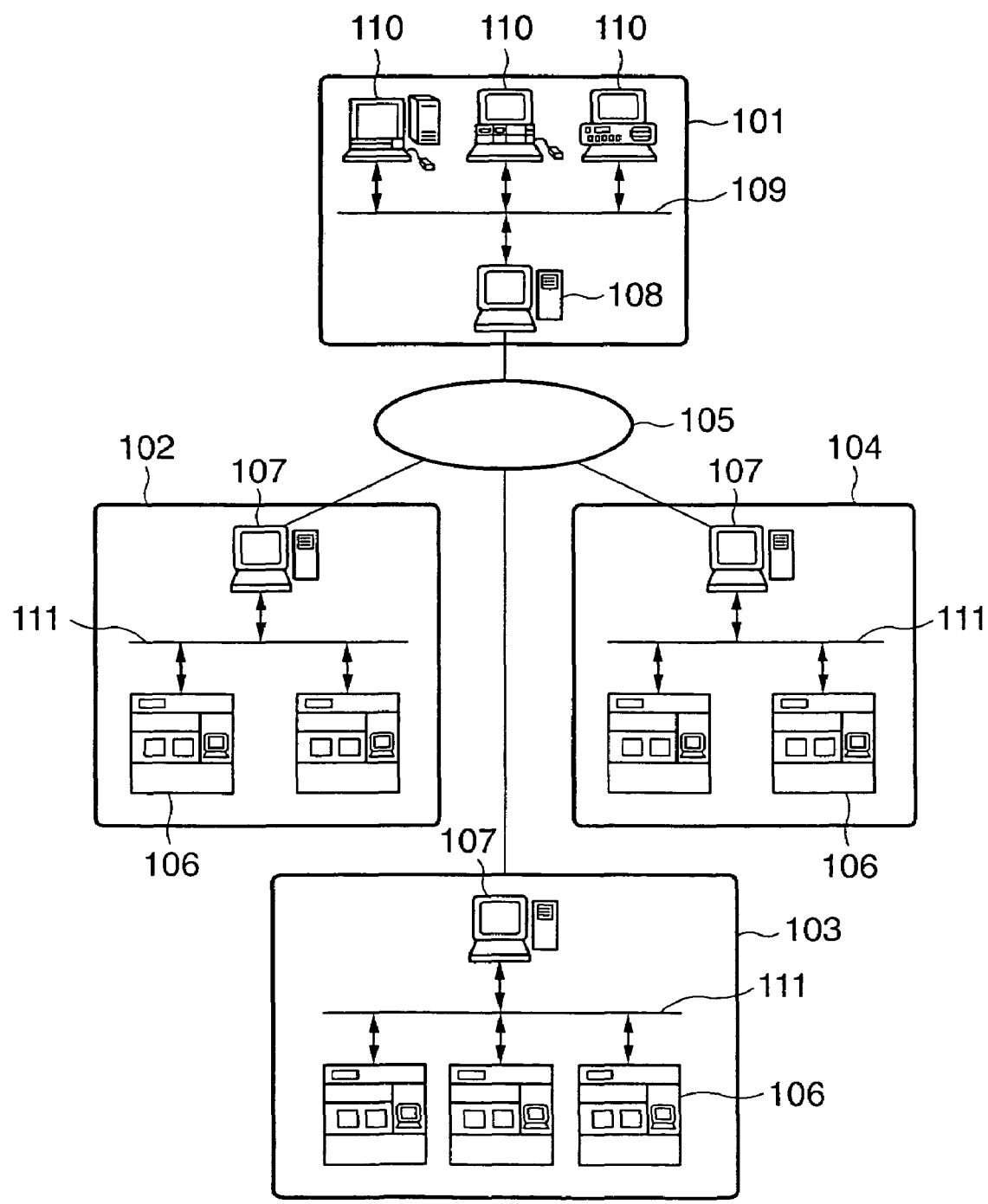
FIG. 4 is a view showing a semiconductor device production system including the exposure apparatus according to an embodiment of the present invention when viewed from a given angle.

FIG. 4 shows the overall system cut out at a given angle. In FIG. 4, reference numeral 101 denotes a business office of a vendor (apparatus supply manufacturer), which provides a semiconductor device manufacturing apparatus. Assumed examples of the manufacturing apparatus are semiconductor manufacturing apparatus for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to construct an intranet. The host management system 108 has a gateway for connecting the LAN 109 to the Internet 105 as an external network of the business office, and a security function for limiting external access.

Reference numerals 102 to 104 denote manufacturing factories of the semiconductor manufacturer (semiconductor device manufacturer) as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user.

More specifically, the factory notifies the vendor via the Internet 105 of status information (e.g., the symptom of a manufacturing apparatus in trouble) representing the operation status of each manufacturing apparatus 106. The factory can receive, from the vendor, response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated-line network (e.g., an ISDN) having high security which inhibits access of a third party can be adopted. It is also possible that the user constructs a database in addition to one provided by the vendor and sets the database on an external network and that the host management system authorizes access to the database from a plurality of user factories.

Figure 5:
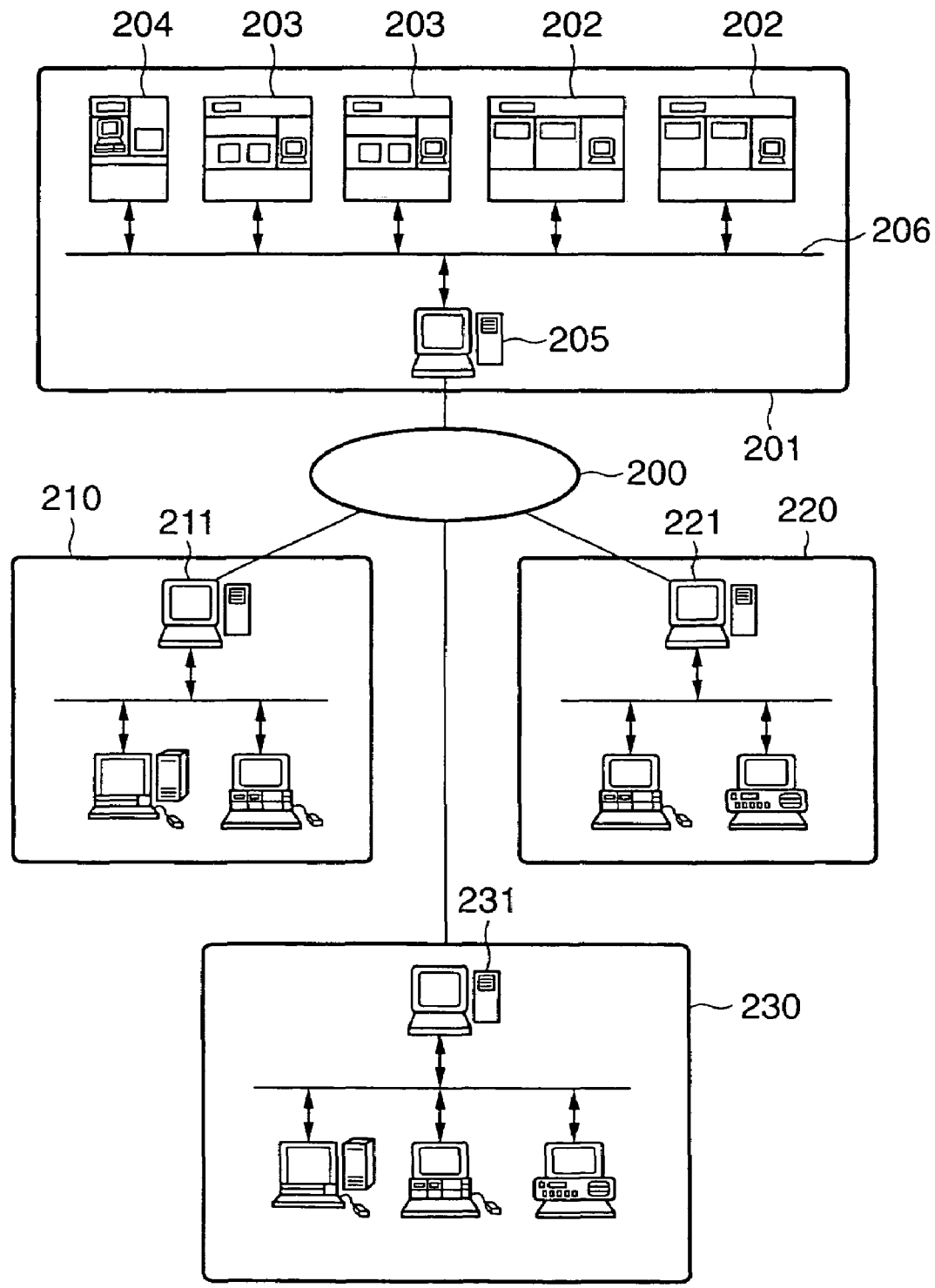
FIG. 5 is a view showing the semiconductor device production system including the exposure apparatus according to the embodiment of the present invention when viewed from another angle.

FIG. 5 is a view showing the concept of the overall system of this embodiment that is cut out at a different angle from FIG. 4. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 5, a factory having manufacturing apparatuses of a plurality of vendors, and the management systems of the vendors for these manufacturing apparatuses are connected via the external network of the factory, and maintenance information of each manufacturing apparatus is communicated. In FIG. 5, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory.

FIG. 5 shows only one manufacturing factory 201, but a plurality of factories are networked in practice. The respective apparatuses in the factory are connected to a LAN 206 to construct an intranet, and a host management system 205 manages the operation of the manufacturing line. The business offices of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as describe above. The host management system 205 for managing the apparatuses in the manufacturing factory of the user, and the management systems 211, 221, and 23 of the vendors for the respective apparatuses are connected via the Internet or dedicated-line network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 6 on the display. While referring to this window, the operator who manages manufacturing apparatuses in each factory inputs, in input items on the windows, pieces of information such as the type of manufacturing apparatus 401, serial number 402, subject of trouble 403, occurrence date 404, degree of urgency 405, symptom 406, remedy 407, and progress 408. The pieces of input information are transmitted to the maintenance database via the Internet, and appropriate maintenance information is sent back from the maintenance database and displayed on the display.

The user interface provided by the web browser realizes hyperlink functions 410, 411, and 412, as shown in FIG. 6. This allows the operator to access detailed information of each item, receive the latest-version software library provided by a vendor, and receive an operation guide (help information) as a reference for the operator in the factory. The maintenance information provided by the maintenance database also includes information about the features of the present invention described above. The software library also provides the latest-version software for implementing the features of the present invention.

Figure 7:
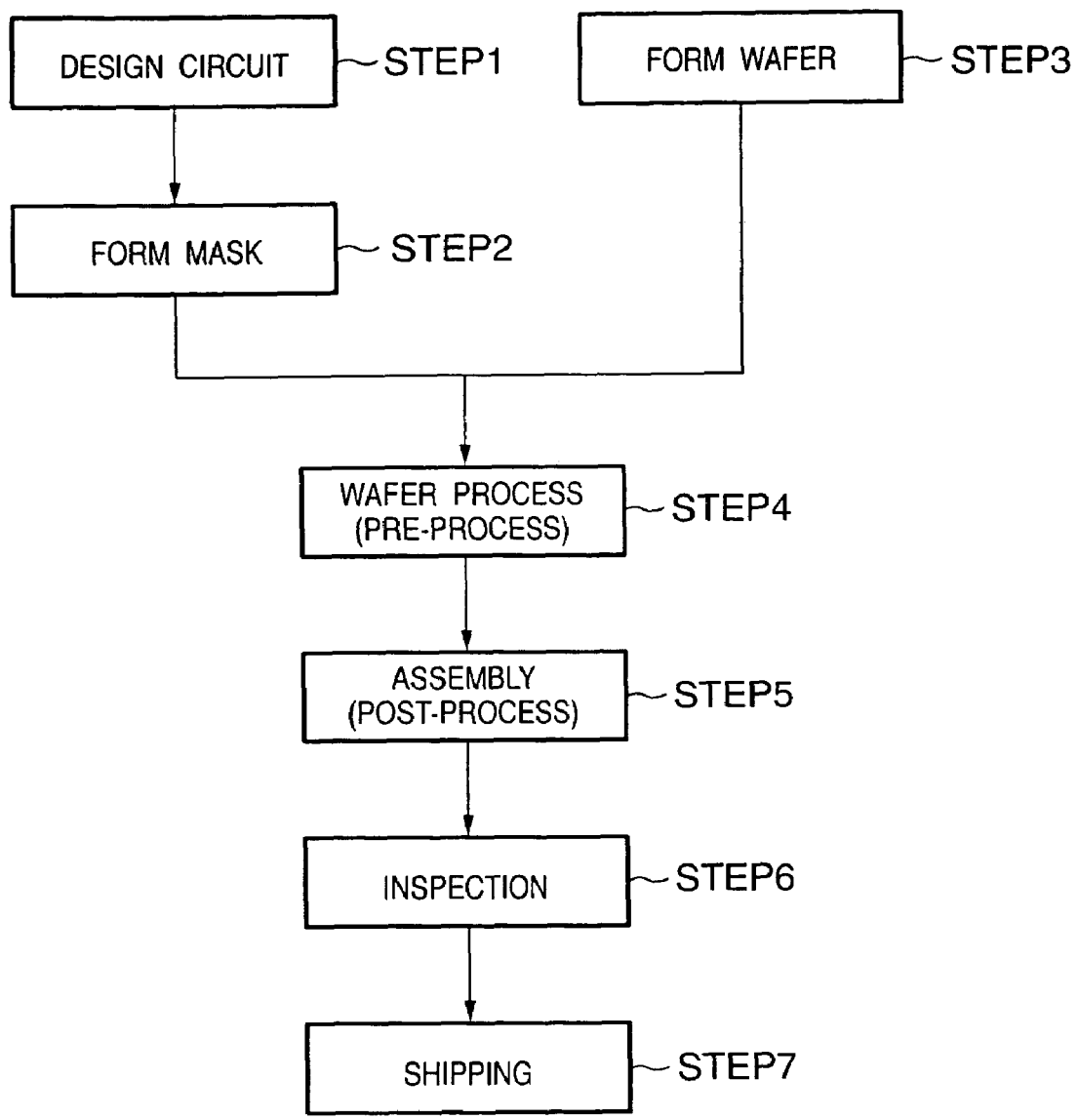
FIG. 7 is a flow chart for explaining a device manufacturing apparatus process performed by the exposure apparatus according to the embodiment of the present invention.

A semiconductor device manufacturing process using the above-described production system will be explained. FIG. 7 shows the flow of the whole manufacturing process of the semiconductor device. In step 1 (circuit design), a semiconductor device circuit is designed. In step 2 (master formation), a master having a designed circuit pattern is formed. In step 3, (wafer manufacture), a wafer is manufactured using a material such as silicon. In step 4 (wafer process) called a pre-process, an actual circuit is formed on the wafer by lithography using the prepared master and wafer. Step 5 (assembly) called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done in each of the factories by the above-described remote maintenance system. Information for production management and apparatus maintenance is communicated between the pre-process factory and the post-process factory via the Internet or dedicated-line network.

Figure 8:
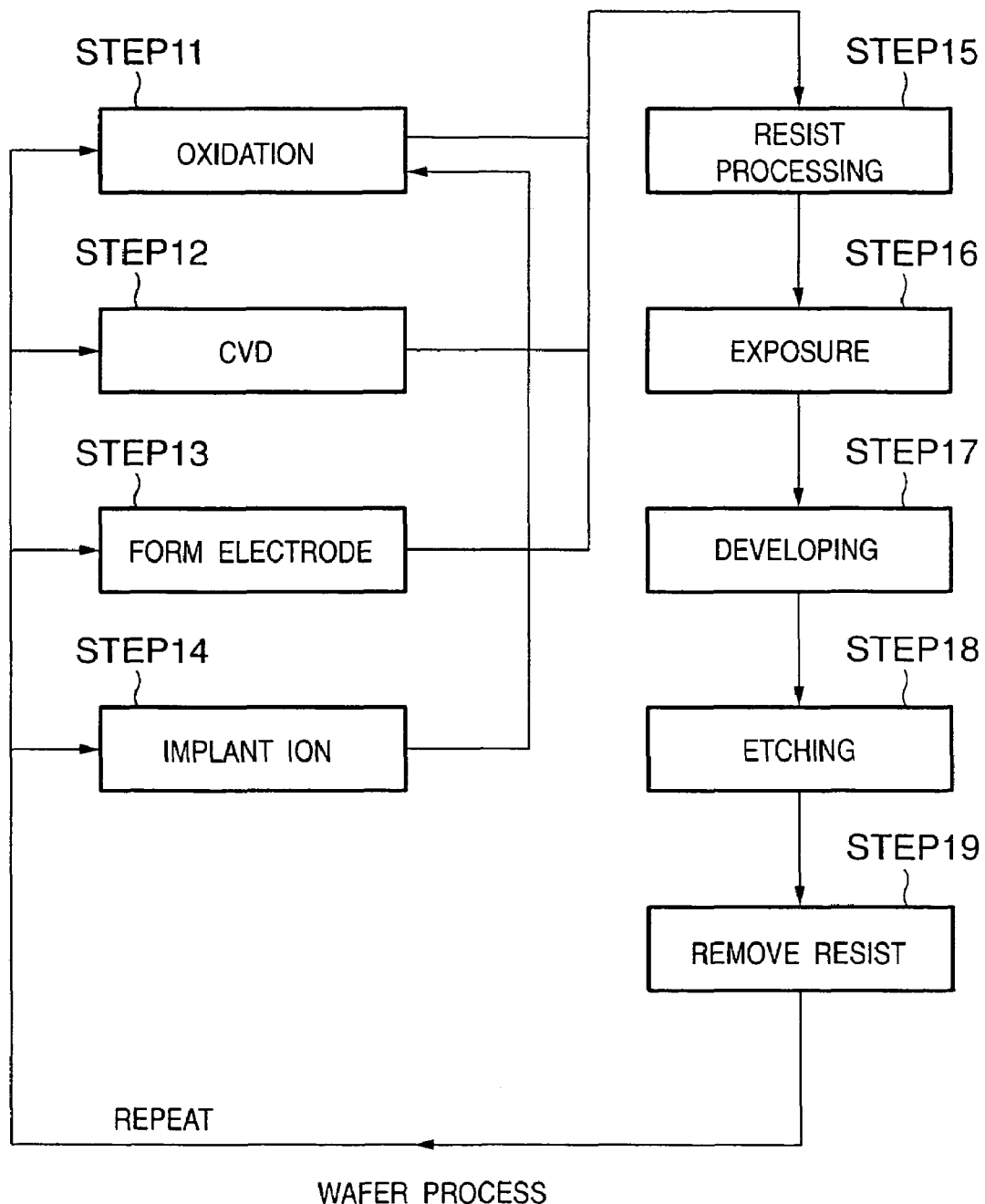
FIG. 8 is a flow chart for explaining a wafer process performed by the exposure apparatus according to the embodiment of the present invention.

FIG. 8 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a master. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, the present invention can greatly decrease the light absorption loss of an exposure beam. The use of a master stock means enables stocking a plurality of masters in an exposure apparatus in advance. Since the transfer distance from the stock means to an exposure position is short, masters can be exchanged within a short time. A load-lock chamber is disposed, and a master is transferred to the stock means via the load-lock chamber. The master can be transferred without adversely influencing the environment of the optical path of an exposure beam near the exposure position of the master. Accordingly, a low-cost, high-throughput exposure apparatus can be provided.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to a pattern of a reticle, said apparatus comprising:
   a reticle stage, to hold the reticle, the substrate is exposed to the pattern of the reticle on said reticle stage;

a stage housing, surrounding said reticle stage, to be filled with a first atmosphere therein, the first atmosphere being different from a second atmosphere of an outside of said stage housing;

a load-lock chamber through which the reticle is transferred from the outside of said stage housing to an inside of said stage housing; and a stocker, for stocking the reticle which has been transferred from the outside of said stage housing through said load-lock chamber, said stocker having a unit to selectively open said stocker for exposing an inside of said stocker to the inside of said stage housing to transfer the reticle between said reticle stage and said stocker.

2. An apparatus according to claim 1, wherein said stocker is arranged outside said stage housing and is in contact with said stage housing.

3. An apparatus according to claim 1, further comprising:

an alignment stage for aligning the reticle; and a transfer unit to transfer the reticle between said alignment stage and said reticle stage, wherein said stage housing further surrounds said alignment stage and said transfer unit.

4. An apparatus according to claim 1, wherein said stage housing has a transmission port for transmitting an exposure beam.

5. An apparatus according to claim 1, wherein said stage housing has a supply port for supplying an inert gas into said stage housing.

6. An apparatus according to claim 1, wherein said stocker has a supply port for supplying an inert gas into said stocker.

7. An apparatus according to claim 1, wherein the first atmosphere is at least one of an inert gas atmosphere and a vacuum atmosphere.

8. An apparatus according to claim 1, wherein the substrate is exposed to the pattern of the reticle with a beam from one of an $F_2$ excimer laser light source and an Extreme Ultraviolet light source.

9. An apparatus according to claim 1, wherein said stocker stocks a plurality of reticles.

10. A method of manufacturing a device, said method comprising steps of:

exposing a substrate to a pattern of a reticle using an exposure apparatus as defined in claim 1;

developing the exposed substrate; and processing the developed substrate to manufacture the device.

* * * * *